United States Patent
Reingruber et al.

(10) Patent No.: US 10,115,668 B2
(45) Date of Patent: Oct. 30, 2018

(54) SEMICONDUCTOR PACKAGE HAVING A VARIABLE REDISTRIBUTION LAYER THICKNESS

(71) Applicant: Intel IP Corporation, Santa Clara, CA (US)

(72) Inventors: Klaus Jürgen Reingruber, Langquaid (DE); Sven Albers, Regensburg (DE); Christian Georg Geissler, Teugn (DE); Georg Seidemann, Landshut (DE); Bernd Waidhas, Pettendorf (DE); Thomas Wagner, Regelsbach (DE); Marc Dittes, Regensburg (DE)

(73) Assignee: Intel IP Corporation, Santa Clara, CA (US)

( * ) Notice: Subject to any disclaimer, the term of this patent is extended or adjusted under 35 U.S.C. 154(b) by 138 days.

(21) Appl. No.: 14/970,355

(22) Filed: Dec. 15, 2015

(65) Prior Publication Data
US 2017/0170111 A1 Jun. 15, 2017

(51) Int. Cl.
*H01L 23/522* (2006.01)
*H01L 23/528* (2006.01)
(Continued)

(52) U.S. Cl.
CPC ............ *H01L 23/528* (2013.01); *C25D 5/022* (2013.01); *C25D 5/10* (2013.01); *C25D 5/48* (2013.01);
(Continued)

(58) Field of Classification Search
CPC . H01L 23/528; H01L 24/19; H01L 23/49838; H01L 23/49822; H01L 24/20; H01L 24/09; H01L 23/5226; H01L 2924/14; H01L 23/49816; H01L 2224/12105; H01L 2224/04105; H01L 2924/10253; C25D 5/10; C25D 5/48;
(Continued)

(56) References Cited

U.S. PATENT DOCUMENTS 7,144,759 B1 * 12/2006 Hilton ................. H01L 21/4857
257/E21.503
2002/0113324 A1 * 8/2002 Cordes ................ H01L 21/4857
257/784

(Continued)

FOREIGN PATENT DOCUMENTS

KR 10-2015-0010896 A 1/2015
KR 10-2015-0079424 A 7/2015

OTHER PUBLICATIONS

PCT International Search Report and Written Opinion for PCT International Appln No. PCT/US2016/055447 dated Jan. 10, 2017. (10 pages).

*Primary Examiner* — Joseph C Nicely
*Assistant Examiner* — Pavel Ivanov
(74) *Attorney, Agent, or Firm* — Schwabe, Williamson & Wyatt, P.C.

(57) ABSTRACT

Semiconductor packages having variable redistribution layer thicknesses are described. In an example, a semiconductor package includes a redistribution layer on a dielectric layer, and the redistribution layer includes first conductive traces having a first thickness and second conductive traces having a second thickness. The first thickness may be different than the second thickness, e.g., the first thickness may be less than the second thickness.

10 Claims, 12 Drawing Sheets

(51) Int. Cl.
*C25D 5/02* (2006.01)
*C25D 5/10* (2006.01)
*C25D 5/48* (2006.01)
*C25D 5/54* (2006.01)
*C25D 7/12* (2006.01)
*H01L 23/00* (2006.01)
*H05K 1/02* (2006.01)
*H05K 1/11* (2006.01)
*H01L 23/498* (2006.01)

(52) U.S. Cl.
CPC ............... *C25D 5/54* (2013.01); *C25D 7/123* (2013.01); *H01L 23/49822* (2013.01); *H01L 23/49838* (2013.01); *H01L 23/5226* (2013.01); *H01L 24/09* (2013.01); *H01L 24/19* (2013.01); *H01L 24/20* (2013.01); *H05K 1/0296* (2013.01); *H05K 1/111* (2013.01); *H05K 1/115* (2013.01); *H01L 23/49816* (2013.01); *H01L 2224/04105* (2013.01); *H01L 2224/12105* (2013.01); *H01L 2924/10253* (2013.01); *H01L 2924/14* (2013.01)

(58) Field of Classification Search
CPC .......... C25D 7/123; C25D 5/022; C25D 5/54; H05K 1/115; H05K 1/0296; H05K 1/111
See application file for complete search history.

(56) References Cited

U.S. PATENT DOCUMENTS

| | | | |
|---|---|---|---|
| 2006/0176145 A1* | 8/2006 | Min | H01C 7/006 338/309 |
| 2009/0206470 A1* | 8/2009 | Horiuchi | H01L 23/5389 257/698 |
| 2011/0003440 A1* | 1/2011 | Mengel | C23C 14/048 438/127 |
| 2014/0054802 A1 | 2/2014 | Shim et al. | |
| 2015/0044864 A1 | 2/2015 | Daubenspeck et al. | |
| 2015/0187710 A1 | 7/2015 | Scanlan et al. | |
| 2016/0181215 A1* | 6/2016 | Sullivan | H01L 23/49827 257/737 |
| 2016/0307852 A1* | 10/2016 | Shih | H01L 23/552 |

* cited by examiner

US 10,115,668 B2

SEMICONDUCTOR PACKAGE HAVING A VARIABLE REDISTRIBUTION LAYER THICKNESS

TECHNICAL FIELD

Embodiments of the invention are in the field of semiconductor packages and, in particular, semiconductor packages having variable redistribution layer thicknesses.

BACKGROUND

Semiconductor packages are used for protecting an integrated circuit (IC) chip or die, and also to provide the die with an electrical interface to external circuitry, e.g., a printed circuit board (PCB). With the increasing demand for smaller electronic devices, semiconductor packages are designed to be even more compact and must support larger circuit density. Semiconductor packages normally include a package wafer having a stack up of conducting and dielectric layers with electrical connections to bring an electrical signal from one side of the package wafer (an IC side) to an opposite side (a PCB side). For example, wafer level packages such as embedded wafer level ball grid arrays (eWLBs) include one or more patterned redistribution layers (RDLs) to provide a fan out from close-pitch wafer pads on an IC to corresponding relaxed-pitch contact pads on a PCB. The patterned RDLs normally have a single thickness for all conductive traces within the same physical layer of the pattern. This fixed-thickness architecture of the patterned RDL translates into a single minimal spacing or minimal pitch for regular patterns of the conductive traces of the RDL.

DESCRIPTION OF EMBODIMENTS

Semiconductor packages having variable redistribution layer (RDL) thicknesses or pitches are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Existing patterned RDLs having a single thickness for all conductive traces within a same physical layer of the pattern also having a single minimal spacing/pitch for regular patterns of the conductive traces in the patterned RDL. This fixed architecture leads to a sub-optimal solution, since the minimal thickness must be selected to accommodate the maximum electrical current in the RDL. For example, some pins of an integrated circuit in a semiconductor package may be power pins that require higher electrical current than other pins of the integrated circuit used for I/O signals. Even though conductive traces used to carry the I/O signals need not be as thick as conductive traces used to carry power, the fixed architecture of existing patterned RDLs requires both conductive traces to have the same larger thickness. Furthermore, the larger thickness requires a larger minimum spacing/pitch between the conductive traces, which limits the trace density in the fan out area (or other areas such as a fan in area).

In an aspect, a semiconductor package includes an RDL having conductive traces with variable thicknesses. That is, conductive traces within the same physical layer of the RDL may be formed with different thicknesses that match a corresponding electrical current used for respective signals. Accordingly, some conductive traces in the RDL, e.g., traces used to transmit lower current signals, may be formed thinner than other conductive traces in the RDL, e.g., traces used to transmit higher current signals. As such, a pitch between the thinner conductive traces may also be less than a pitch between the thicker conductive traces to allow for a denser regular pattern to be achieved, e.g., in a fan out area (or other areas such as a fan in area) of an embedded wafer level ball grid array (eWLB).

Figure 1:
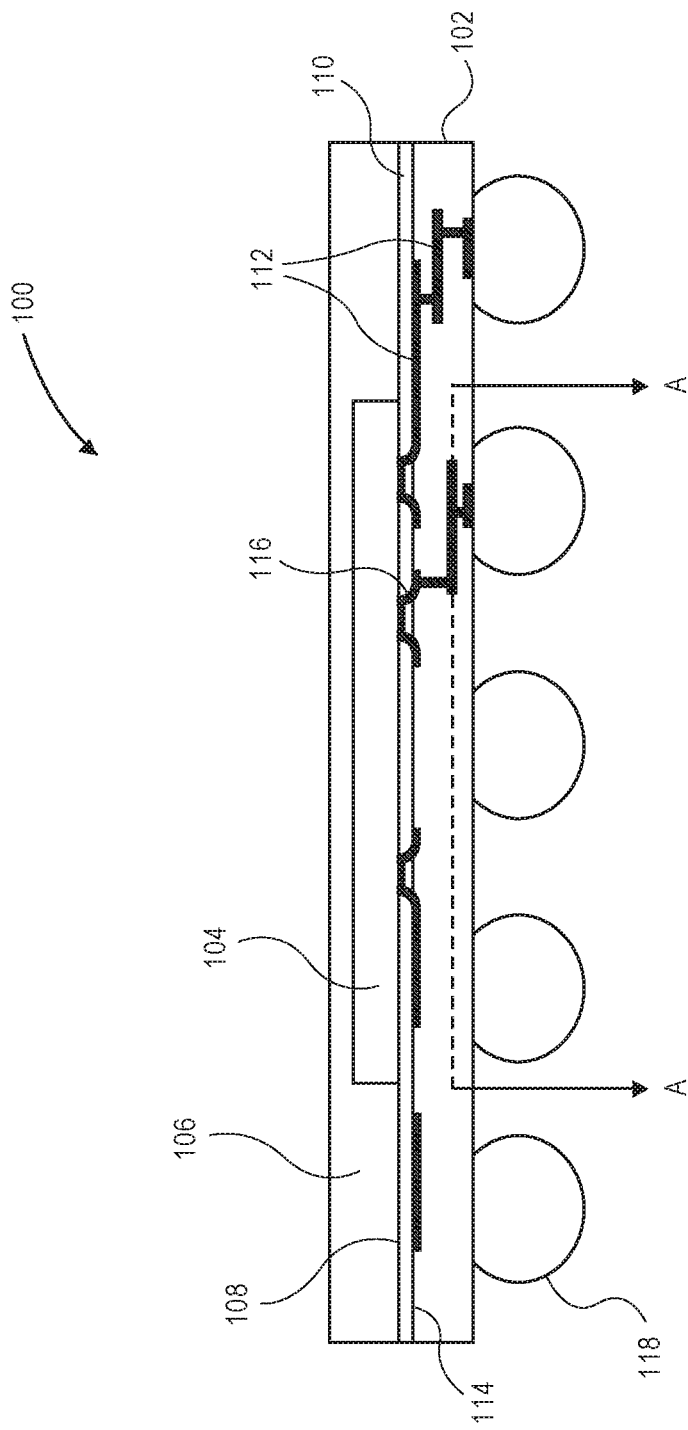
FIG. 1 illustrates a sectional view of a semiconductor package having a dielectric layer and a redistribution layer, in accordance with an embodiment.

Referring to FIG. 1, a sectional view of a semiconductor package having a dielectric layer and a redistribution layer is illustrated in accordance with an embodiment. A semiconductor package 100 may include a wafer layer 102 having conducting and dielectric layers. Semiconductor package 100 may be an eWLB having an integrated circuit 104, e.g., a silicon die, combined with a mold compound 106 to form an artificial wafer, and the artificial wafer may be mounted on wafer layer 102. More particularly, integrated circuit 104 may be mounted on a front surface 108 of a dielectric layer 110 of wafer layer 102, and chip pads (not shown) of integrated circuit 104 may be interconnected to a redistribution layer 112 mounted on a back surface 114 of dielectric layer 110. For example, the chip pads may be electrically connected to one or more via 116 extending through openings in dielectric layer 110. Vias 116 may electrically connect the chip pads on a first side of dielectric layer 110 to redistribution layer 112 on a second, opposite, side of dielectric layer 110.

Wafer layer 102 of semiconductor package 100 may include a stack up of dielectric layers 110 and redistribution layers 112. In an embodiment, redistribution layer 112 provides a fan out to close a gap from a close-pitch of the wafer pads to a relaxed-pitch of contact pads on a corresponding printed circuit board (PCB). Thus, several redistribution layers 112 may be interconnected by vias 116 to carry electrical signals between the integrated circuit side of wafer layer 102 and an opposite PCB side of wafer layer 102. Accordingly, the electrical signals may be carried between chip pads of integrated circuit 104 on the integrated circuit side of wafer layer 102 and one or more solder balls 118 on the PCB side of wafer layer 102. Solder balls 118 may be used to physically and electrically connect semiconductor package 100 to the corresponding PCB. As described below, one or more of the redistribution layers 112 may include conductive traces having different thicknesses and/or pitches. Accordingly, the conductive traces may be matched to the respective electrical signals being carried by the traces.

Figure 2:
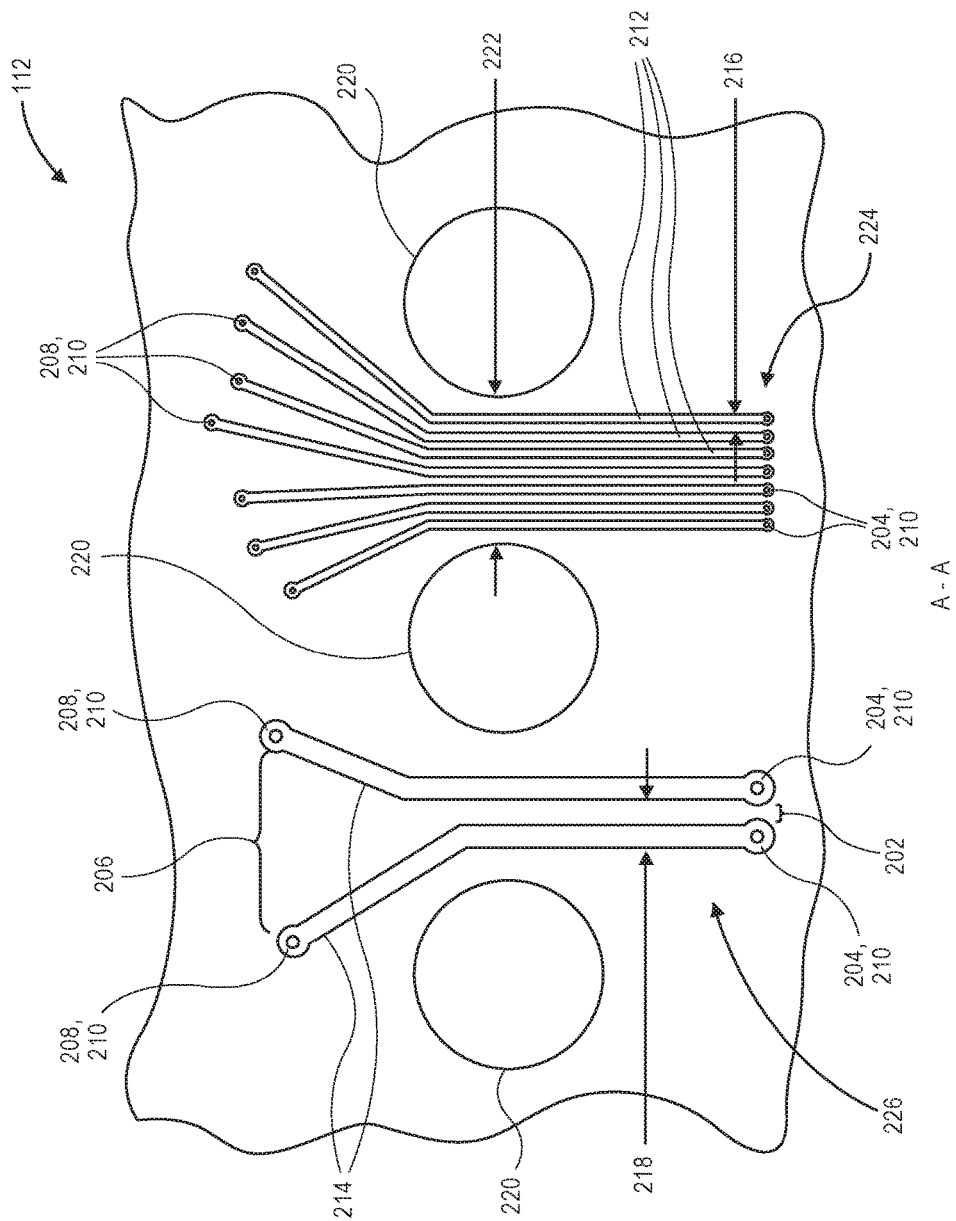
FIG. 2 illustrates a top-down view, taken about line A-A of FIG. 1, of a redistribution layer having conductive traces of differing thicknesses and pitches, in accordance with an embodiment.

Referring to FIG. 2, a top-down view, taken about line A-A of FIG. 1, of a redistribution layer having conductive traces of differing thicknesses and pitches is illustrated in accordance with an embodiment. Redistribution layer 112 can be any of the conductive layers of wafer layer 102. More particularly, redistribution layer 112 may be a first redistribution layer on an opposite side of dielectric layer 110 from integrated circuit 104, a second redistribution layer on an opposite side of dielectric layer 110 from integrated circuit 104, or any other redistribution layer between dielectric layer 110 and solder balls 118. As shown, redistribution layer 112 may include conductive traces within a fan out area of an eWLB (or in another area of the eWLB, such as a fan in area). This is apparent because a first distance 202 between respective first ends 204 of the conductive traces is less than a second distance 206 between respective second ends 208 of the conductive traces. The conductive traces may extend from first ends 204 at respective openings 210 in dielectric layer in front of redistribution layer 112 to respective second ends 208 at corresponding openings 210 in a second dielectric layer behind redistribution layer 112. The openings 210 may extend between opposite sides of the respective dielectric layers, e.g., several openings 210 may extend from front surface 108 to back surface 114 of dielectric layer 110. Thus, vias 116 within openings 210 may carry electrical signals vertically through wafer layer 102, and conductive traces may carry electrical signals horizontally through wafer layer 102.

In an embodiment, redistribution layer 112 is on back surface 114 of dielectric layer 110, and includes several first conductive traces 212 and several second conductive traces 214. The conductive traces may share a same planar surface, e.g., back surface 114 of dielectric layer 110, or may be disposed in a same layer between two adjacent dielectric layers. Furthermore, as described below, the conductive traces may be grown together in a same physical process. Accordingly, first conductive traces 212 and second conductive traces 214 may be in a same physical layer of semiconductor package 100, i.e., in redistribution layer 112.

First conductive traces 212 may include a first thickness, and second conductive traces 214 may include a second thickness. The thicknesses of the conductive traces may be into the page. That is, the thickness may be a distance vertically through the conductive traces between dielectric layer 110 in front of redistribution layer 112 and a second dielectric layer behind redistribution layer 112. In an embodiment, the first thickness of first conductive traces 212 is different than the second thickness of second conductive traces 214. For example, the first thickness may be less than the second thickness.

By virtue of the processing techniques used to fabricate redistribution layer 112, a pitch of a regular pattern of conductive traces may be proportional to the thickness of the conductive traces. That is, a regular pattern of thinner conductive traces may have a smaller pitch than a regular pattern of thicker conductive traces. A pitch of conductive traces may be defined as a distance that includes a width of a conductive trace and a space between the conductive trace and an adjacent conductive trace. For example, first conductive traces 212 are illustrated as having a first pitch 216, and second conductive traces 214 are illustrated as having a second pitch 218 (FIG. 2). By contrast, spacing of conductive traces in a regular pattern may be defined as a distance between adjacent edges of adjacent conductive traces. Thus, a pitch of conductive traces includes a spacing of the conductive traces.

A regular pattern of conductive traces refers to a design rule of conductive traces running parallel to each other. For example, as illustrated in FIG. 2, redistribution layer 112 may include a pair of solder pads 220 on back surface 114 of dielectric layer 110. Solder pads 220 may be vertically aligned with corresponding solder balls 118 used to connect semiconductor package 100 to a corresponding PCB. Within a fan out area of an eWLB, conductive traces may be required to avoid solder pads 220, and thus, conductive traces may be routed through a pad gap 222 between the pair of solder pads 220. By way of example, pad gap 222 may be a distance of less than 200 microns, e.g., 160 microns. As such, first conductive traces 212 may extend through pad gap 222 in a first regular pattern 224 having first pitch 216. Similarly, second conductive traces 214 may extend through another pad gap of a corresponding pair of solder pads 220 in a second regular pattern 226 having second pitch 218. First pitch 216 of first conductive traces 212 extending over back surface 114 in first regular pattern 224 may be less than second pitch 218 of second conductive traces 214 extending over back surface 114 in second regular pattern 226. That is, the respective pitches of the conductive traces may be proportional to the respective thicknesses of the conductive traces. Given that first regular pattern 224 may have a smaller pitch then second regular pattern 226, more first conductive traces 212 may be routed through pad gap 222 than second conductive traces 214. For example, only no more than two second conductive traces 214 having a pitch typical of redistribution layers having fixed-thicknesses may be routed through pad gap 222. By contrast, three or more first conductive traces 212 having a fine pitch corresponding to a trace thickness matching lower electrical current signals may be routed through pad gap 222.

Semiconductor packages having variable RDLs may therefore include several traces that intentionally include different thicknesses and/or pitches than several other traces in the RDL. One skilled in the art will recognize that some variability may inherently occur among thicknesses of RDL traces by virtue of semiconductor processing tolerances. For example, within an RDL formed using conventional processing techniques, a thickness of all traces may vary by 5% even when the manufacturer desires the thicknesses to be the same, given that processes (such as deposition processes) inherently include manufacturing tolerances. In an embodiment, however, conductive traces within an RDL include thicknesses that differ significantly from each other (as a result of the intentionality of the embodiments described herein). Here, the term "significantly" refers to a difference in thickness that is outside of the normal tolerance range of the manufacturing processes used to form the RDL, thus indicating that the difference is intentional rather than an unavoidable result of the current state of technology. For example, an RDL having three or more conductive traces may include two or more traces within the RDL that have a trace thickness that is significantly different (greater or less than) a trace thickness of the other trace(s) in the RDL. By way of example, the thickness of the two or more conductive traces may have a thickness that is at least 15% different than the thickness of the other conductive trace(s). For example, a difference between the thickness of the first set of conductive traces and the second set of conductive traces may be greater than 20% of the thinnest set of RDL trace(s).

By way of example, a simulation has been performed showing that when solder pads 220 are distributed in a regular grid pattern having a 400 micron pitch, and the solder pads 220 each include a diameter of 240 microns, pad gap 222 is 160 microns wide. In such case, when second conductive traces 214 are standard redistribution layer lines having spacing (distance between adjacent conductive traces) of 30 microns, only 2 second conductive traces 214 can be routed through pad gap 222. By contrast, when first conductive traces 212 have thicknesses tuned to lower electrical current signals, a spacing of 5 microns between first conductive traces 212 may be used, allowing 15 first conductive traces 212 to be routed through pad gap 222.

As shall be described further below, the respective thicknesses of conductive traces may be formed using a method to add one or more sub-layers within a same physical layer. A process flow may, for example, use one or more photolithography operations. For example, in an embodiment, a first metal sub-layer may be formed with a first metal deposition operation, e.g., using physical vapor deposition, plating, etc. The first conductive traces 212 may include only the first sub-layer having the thinnest sub-layer thickness, e.g., a metal seed sub-layer of redistribution layer 112. The metal seed sub-layer may have a thickness corresponding to lower electrical current signals. A resist used to form the first metal sub-layer may be stripped, and the first conductive traces 212 may be coated with an additional protective layer to prevent further metal deposition over the thin traces. After applying the additional protective layer, another metal deposition operation may be performed to apply an additional, e.g., a second, sub-layer over the first metal sub-layer in some areas. The portions having a combined thickness of the first and second metal sub-layers may correspond to second conductive traces 214 of redistribution layer 112. Accordingly, second conductive traces 214 may be thicker than first conductive traces 212. The stripping and application of additional resists may be performed in combination with additional metal deposition operations to continue to form additional sub-layers to realize conductive traces having different thicknesses and pitches. Several embodiments of methods of forming a redistribution layer 112 having a variable thickness and/or pitch are described below.

Figure 3:
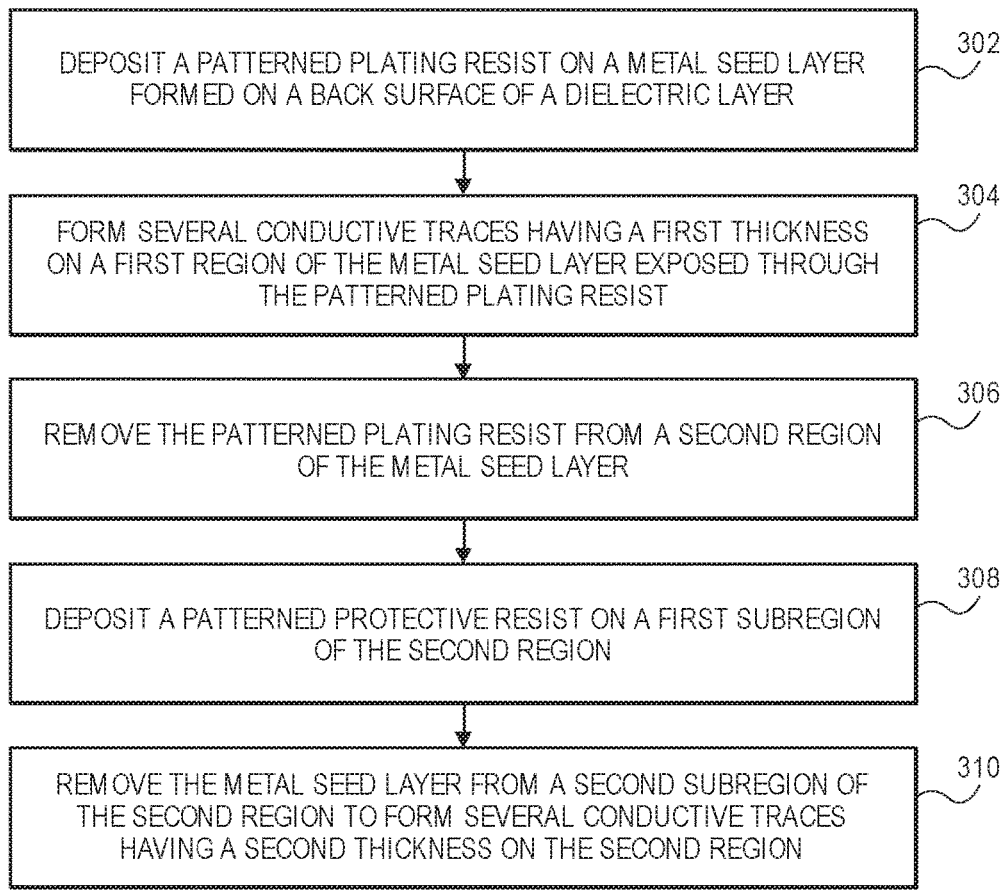
FIG. 3 illustrates a method of fabricating a redistribution layer having conductive traces of differing thicknesses or pitches, in accordance with an embodiment.

Referring to FIG. 3, a method of fabricating a redistribution layer having conductive traces of differing thicknesses or pitches is illustrated in accordance with an embodiment. The method may fabricate a redistribution layer 112 having multiple thicknesses and multiple pitches using a metal seed sub-layer for thin/fine-pitch conductive traces and a metal plated sub-layer for thicker/standard-pitch conductive traces. The operations of the method illustrated in FIG. 3 shall be described below with reference to FIGS. 4A-4I.

Figure 4A:
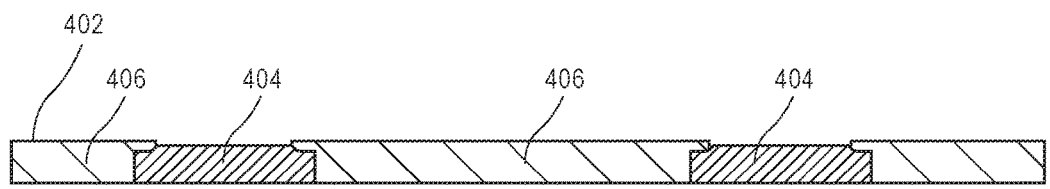
FIGS. 4A-4I illustrate operations of a method of fabricating a redistribution layer having conductive traces of differing thicknesses or pitches, in accordance with an embodiment.

Referring to FIG. 4A, a sectional view of an artificial wafer having integrated circuit 104 is illustrated. Integrated circuit 104 includes several chip pads 404 distributed across bottom surface 402. Chip pads 404 may be silicon. Furthermore, chip pads 404 may be separated by a dielectric buffer 406. Dielectric buffer 406 may, for example, include a silicon nitride material or another known dielectric material. Alternatively, the second view of FIG. 4A may be a second view of a first redistribution layer of wafer layer 102. For example, chip pads 404 shown in FIG. 4A may instead be a contact layer formed from copper or aluminum and separated from each other by dielectric buffer 406 including silicon nitride, polyimide, or another dielectric material. Thus, the view illustrated in FIG. 4A may more broadly be described as a sectional view of a substrate having conductive portions on which dielectric layer 110 and redistribution layer 112 of semiconductor package 100 may be formed.

Figure 4B:
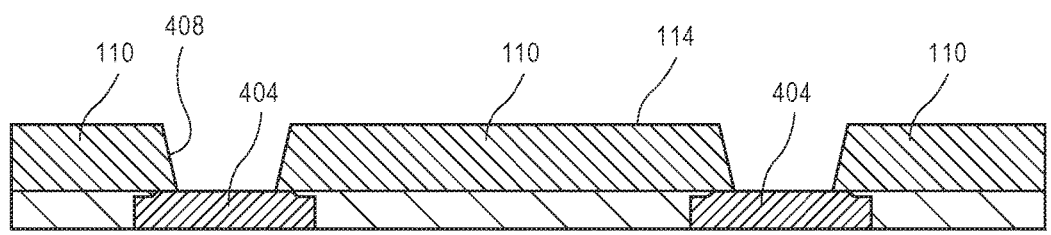

Referring to FIG. 4B, dielectric layer 110 may be deposited and patterned over chip pads 404. For example, dielectric layer 110 may be formed in a spin on process, as in an eWLB process flow. Openings may be formed in dielectric layer 110. That is, dielectric layer material, e.g., polyimide, may be removed to expose chip pad 404 through openings. Thus, an opening wall 408 may extend around a hole through dielectric layer 110 to form an opening extending from chip pad 404 to a space above dielectric layer 110.

Figure 4C:
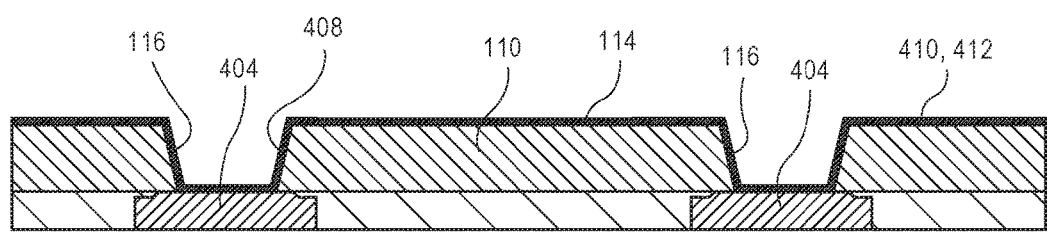

Referring to FIG. 4C, a metal seed layer 410 may be deposited on dielectric layer 110. For example, metal seed layer 410 may be formed by sputtering copper and/or one or more other metals over dielectric layer 110. In an embodiment, metal seed layer 410 includes one or more of titanium, tungsten, nickel, or copper materials to provide adhesion, barrier, conductor, or protection characteristics to metal seed layer 410.

Metal seed layer 410 may cover back surface 114 of dielectric layer 110, opening wall 408, and a top surface of chip pad 404. Thus, metal seed layer 410 may provide a conductive via 116 extending from chip pad 404 to back surface 114 of dielectric layer 110. More particularly, metal seed layer 410 may provide a first sub-layer of redistribution layer 112. Thus, via 116 may electrically connect chip pad 404 to redistribution layer 112 on dielectric layer 110.

Figure 4D:
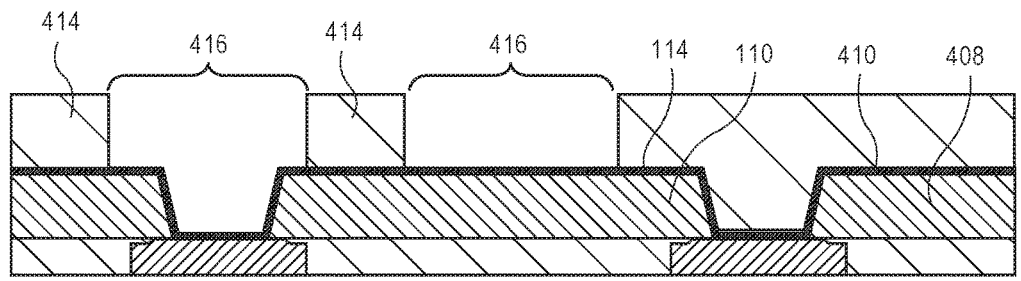

Referring to FIG. 3, at operation 302, a patterned plating resist may be deposited on metal seed layer 410 formed on back surface 114 of dielectric layer 110. As illustrated in FIG. 4D, a patterned plating resist 414 may be applied over metal seed layer 410 formed on back surface 114 of dielectric layer 110. Patterned plating resist 414 may be plated in a pattern to allow for selective deposition during a subsequent electrochemical plating process. For example, a first region 416 of metal seed layer 410 may be exposed through openings in patterned plating resist 414. By contrast, a second region of metal seed layer 410 may be defined as a portion of metal seed layer 410 that is covered by patterned plating resist 414. Thus, patterned plating resist 414 allows for selective plating over the non-covered areas (over first region 416 of metal seed layer 410), but not over the covered areas (not over the second region of metal seed layer 410).

Figure 4E:
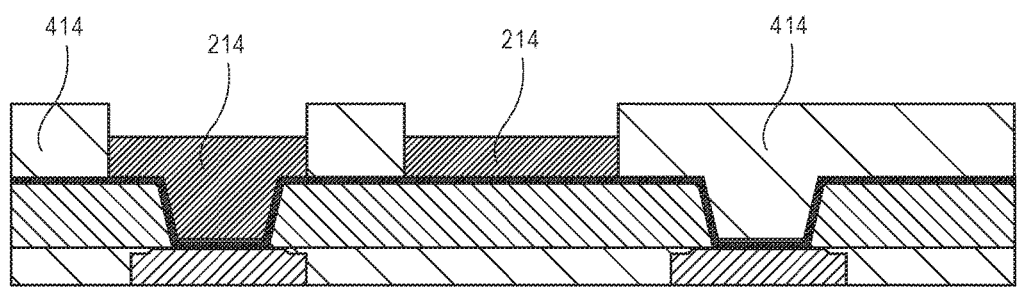

Referring again to FIG. 3, at operation 304, several conductive traces may be formed on first region 416 of metal seed layer 410. As illustrated in FIG. 4E, the open windows of patterned plating resist 414 may be filled with electrochemical plating to form conductive traces. For example, the space above first region 416 (FIG. 4D) may be filled with copper plating to form second conductive traces 214. As described above, second conductive traces 214 may represent a thicker conductive trace of redistribution layer 112 having variable trace thicknesses. For example, second conductive traces 214 on first region 416 of metal seed layer 410 may have a thickness that is typical of conductive traces in fixed-architecture redistribution layers.

Figure 4F:
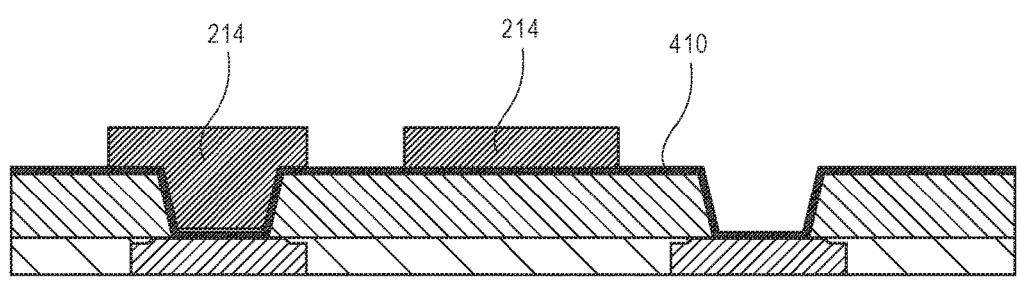

Referring again to FIG. 3, at operation 306, patterned plating resist 414 may be removed from the second region of metal seed layer 410. As illustrated in FIG. 4F, may be stripped to expose second region of metal seed layer 410. That is, the second region that was formerly defined as a region underlying patterned plating resist 414, may now be defined as a region of metal seed layer 410 not forming a first sub-layer 412 of second conductive traces 214 in redistribution layer 112.

Figure 4G:
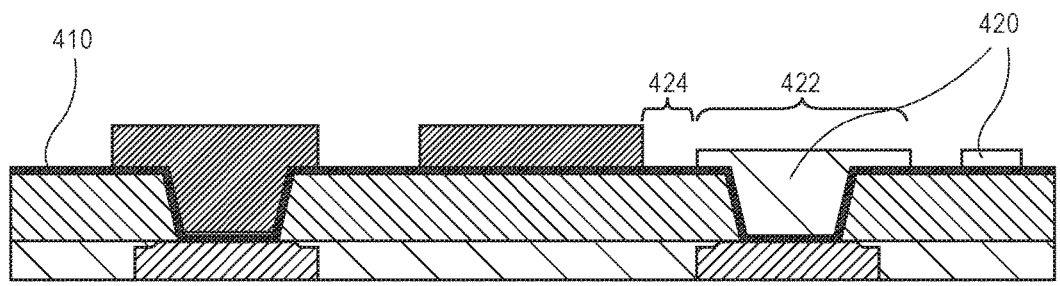

Referring again to FIG. 3, at operation 308, a patterned protective resist may be deposited on a first subregion 422 of second region. As illustrated in FIG. 4G, a patterned protective resist 420 may be applied in a manner similar to patterned plating resist 414, to protect certain areas of metal seed layer 410 while leaving other areas of metal seed layer 410 exposed. That is, patterned protective resist 420 may cover a first subregion 422 of second region of metal seed layer 410. By contrast, patterned protective resist 420 may leave a second subregion 424 of second region of metal seed layer 410 exposed. More particularly, patterned protective resist 420 may be patterned to protect an area of metal seed layer 410 that is desired to remain intact after a subsequent etching operation (first subregion 422), while not protecting an area of metal seed layer 410 that is desired to be removed by the subsequent etching operation (second subregion 424).

Figure 4H:
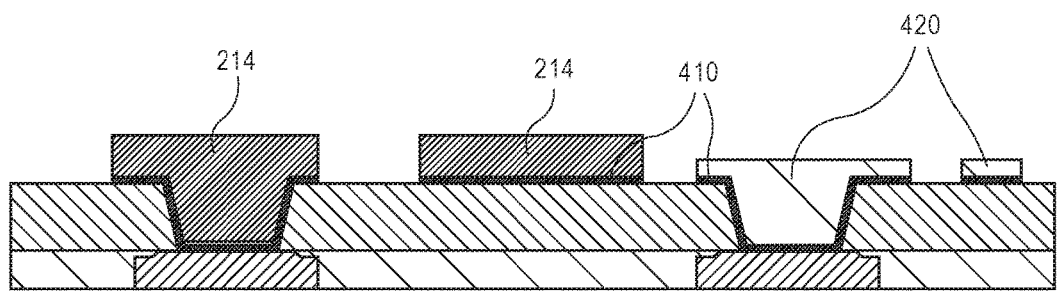

Referring again to FIG. 3, at operation 310, metal seed layer 410 is removed from second subregion 424 of second region to form several conductive traces. As illustrated in FIG. 4H, metal seed layer 410 may be etched away from the exposed portions of both second region and first region under 414 of metal seed layer 410. The exposed portions include both second subregion 424 of second region, and portions of metal seed layer 410 in first region 414 of metal seed layer 410 around second conductive traces 214. Thus, after etching away metal seed layer 410, second regular pattern 226 of second conductive traces 214 may be formed.

Figure 4I:
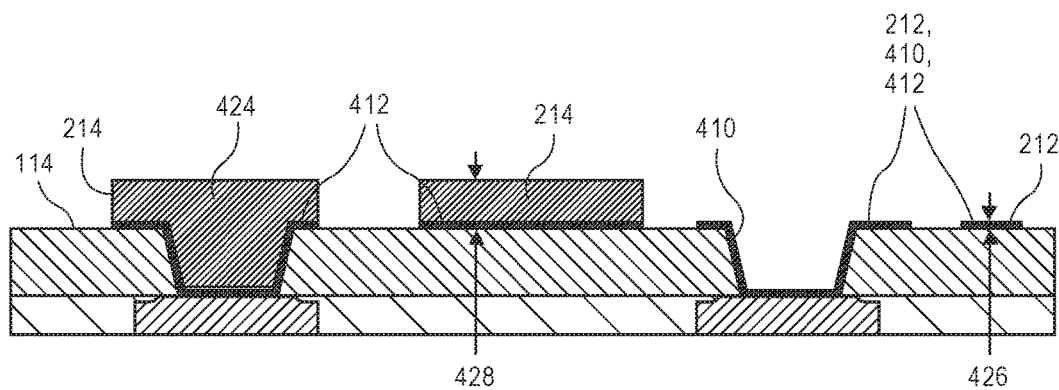

Referring to FIG. 4I and FIG. 2, patterned protective resist 420 may be stripped from first subregion 422 to expose the underlying metal seed layer 410. By doing so, the underlying metal seed layer 410 may form several conductive traces. For example, metal seed layer 410 that remains intact upon removal of patterned protective resist 420 may provide first regular pattern 224 of first conductive traces 212. As described above, first conductive traces 212 may include a thickness different than the thickness of second conductive traces 214. More particularly, first conductive traces 212 may have a first thickness 426 equivalent to the thickness of metal seed layer 410 forming a first sub-layer 412 of redistribution layer 112, and second conductive traces 214 may have a second thickness 428 equivalent to the combined thickness of metal seed layer 410 (first thickness 426) forming first sub-layer 412 of redistribution layer 112 and a second sub-layer of redistribution layer 112 formed during the plating operation described above with respect to FIG. 4E.

As described above, first regular pattern 224 of first conductive traces 212 may differ from second regular pattern 226 of second conductive traces 214. That is, first regular pattern 224 may have a smaller pitch than second regular pattern 226. The reduced pitch may be achieved in part due to the thinner patterned protective resist 420 that can be used during the formation of first conductive traces 212. Since a height of patterned protective resist 420 above back surface 114 may be less than a height of patterned plating resist 414 used to form second conductive traces 214, a spacing between first conductive traces 212 may also be less than a spacing between second conductive traces 214.

Further adaptations and extensions of the method illustrated in FIGS. 4A-4I may be apparent to one skilled in the art. For example, after removing patterned plating resist 414 from second region of metal seed layer 410, an additional sub-layer may be formed above metal seed layer 410 in the areas that are to become first conductive traces 212. For example, another patterned protective resist may be deposited on second conductive traces 214 to protect second conductive traces 214 while the additional sub-layer is being formed. Thus, first conductive traces 212 may ultimately have an intermediate thickness between the thickness of second conductive traces 214 (second thickness 428) and the thickness of metal seed layer 410 (first thickness 426).

In another adaptation of the method described above, second conductive traces 214 may not be protected during the formation of the additional sub-layer on first conductive traces 212. That is, the additional sub-layer may be formed over both first conductive traces 212 and second conductive traces 214 after stripping away patterned plating resist 414. Thus, the additional sub-layer may add to the thickness of both first conductive traces 212 and second conductive traces 214. Accordingly, it will be appreciated that the method of fabricating a redistribution layer 112 having conductive traces of differing thicknesses or pitches described above are to be considered illustrative and not limiting.

Figure 5:
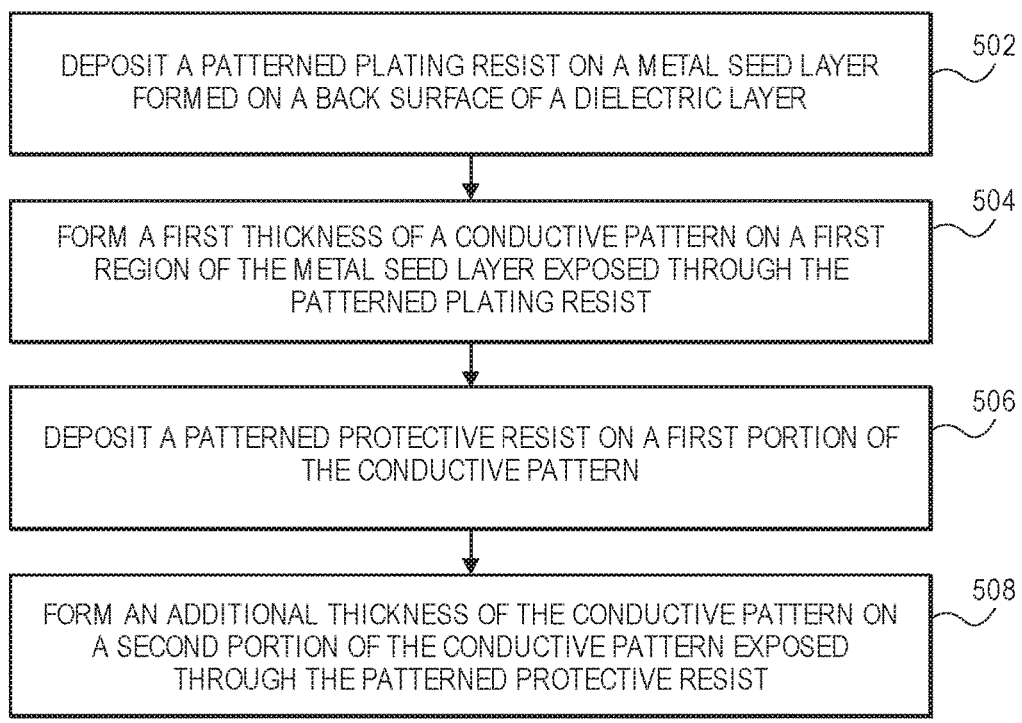
FIG. 5 illustrates a method of fabricating a redistribution layer having conductive traces of differing thicknesses or pitches, in accordance with an embodiment.

Referring to FIG. 5, a method of fabricating a redistribution layer having conductive traces of differing thicknesses or pitches is illustrated in accordance with an embodiment. The method may fabricate a redistribution layer 112 having multiple thicknesses and multiple pitches using a two-operation plating approach to form a first sub-layer for thin/fine-pitch conductive traces and a second sub-layer over the first sub-layer for thicker/standard-pitch conductive traces. The operations of the method illustrated in FIG. 5 shall be described below with reference to FIGS. 6A-6G.

Figure 6A:
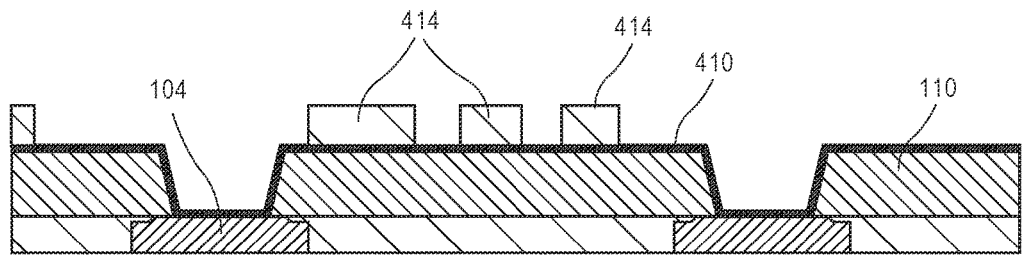
FIGS. 6A-6G illustrate operations of a method of fabricating a redistribution layer having conductive traces of differing thicknesses or pitches, in accordance with an embodiment.

Referring to FIG. 5, at operation 502, a patterned plating resist may be deposited on metal seed layer 410 formed on back surface 114 of dielectric layer 110. As illustrated in FIG. 6A, a semiconductor structure may be provided after processing similar to the sequence of operations illustrated in FIGS. 4A-4C. that is, the semiconductor structure may include metal seed layer 410 on dielectric layer 110 over a base substrate such as integrated circuit 104. Patterned plating resist 414 may be deposited in a manner similar to that described above such that a first region of metal seed layer 410 is exposed through patterned plating resist 414, and a second region of metal seed layer 410 is covered by patterned plating resist 414.

Figure 6B:
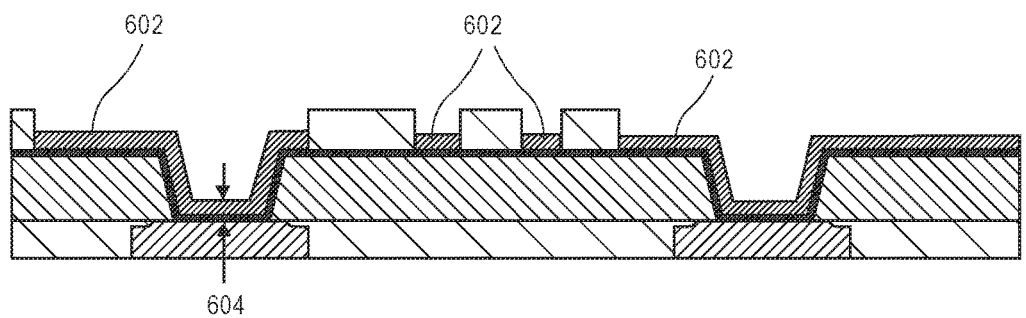

Referring again to FIG. 5, at operation 504, a conductive pattern 602 may be formed on the first region of metal seed layer 410. As illustrated in FIG. 6B, metal such as copper may be plated within the exposed regions between patterned plating resist 414 to form conductive pattern 602. Conductive pattern 602 on the first region of metal seed layer 410 may be plated to have a first thickness 604. First thickness 604 may include a thickness of metal seed layer 410 and the thickness of the plating formed within the exposed regions between patterned plating resist 414.

Figure 6C:
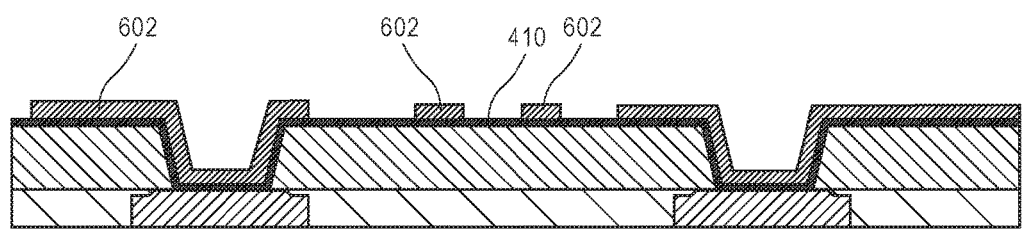

Referring to FIG. 6C, patterned plating resist 414 may be stripped from the semiconductor structure. Accordingly, portions of conductive pattern 602 having first thickness 604 may be separated by portions of metal seed layer 410 that are thinner than first thickness 604.

Figure 6D:
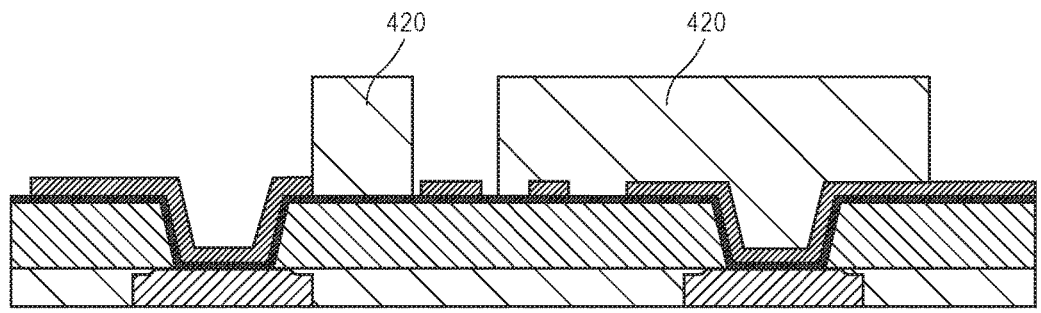

Referring again to FIG. 5, at operation 506, a patterned protective resist 420 may be deposited on a first portion of conductive pattern 602. As illustrated in FIG. 6D, patterned protective resist 420 may cover part of a surface area of conductive pattern 602 (a first portion) and may not cover another part of the surface area of conductive pattern 602 (a second portion). Thus, the second portion of conductive pattern 602 may be exposed through patterned protective resist 420. Similarly, some portions of metal seed layer 410 between conductive pattern 602 may be covered by patterned protective resist 420 while other portions of metal seed layer 410 may not be covered by patterned protective resist 420.

Figure 6E:
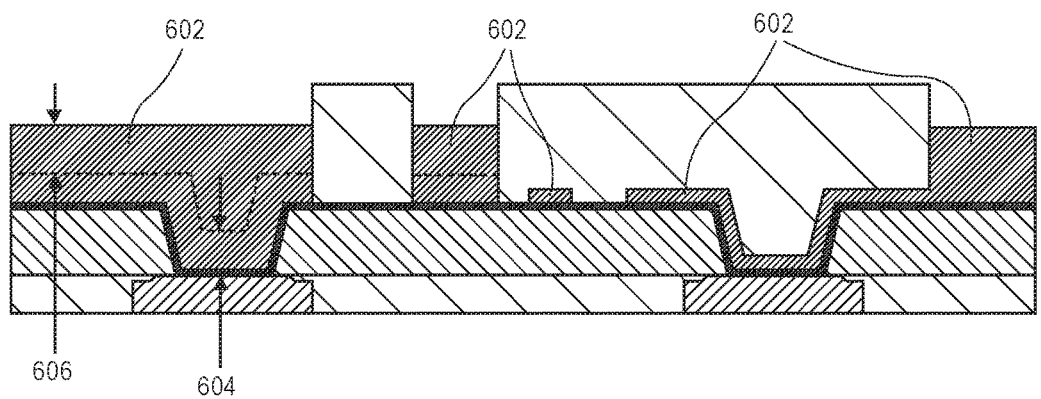

Referring again to FIG. 5, at operation 508, an additional thickness 606 of conductive pattern 602 may be formed on the second portion of conductive pattern 602 that is exposed through patterned protective resist 420. As illustrated in FIG. 6E, an electrochemical plating process may be applied to the exposed areas to build an additional thickness 606 of redistribution layer 112 above first thickness 604 of redistribution layer 112. Accordingly, the method allows for a second sub-layer (plating operation of FIG. 6B) to be formed over a first sub-layer (metal seed layer 410) and then for a third sub-layer (plating operation of FIG. 6E) to be formed over the second sub-layer, resulting in conductive pattern 602 having various regions of various thicknesses.

Figure 6F:
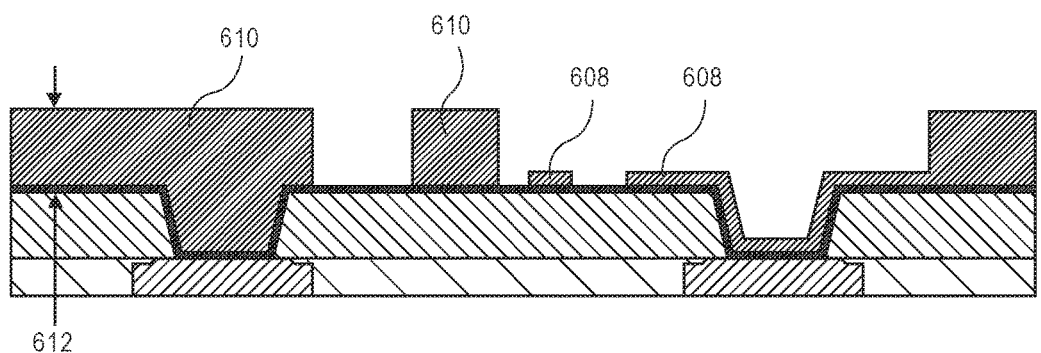

Referring to FIG. 6F, patterned plating resist 420 may be stripped away from the semiconductor structure, leaving one or more first segments 608 and one or more second segments 610 of conductive pattern 602. Each first segment 608 may have first thickness 604 equivalent to the thickness of metal seed layer 410 and the thickness of plating added to conductive pattern 602 during the first plating operation. Each second segment 610 may have a second thickness 612 including first thickness 604 and additional thickness 606 added to conductive pattern 602 during the second plating operation. Thus, conductive pattern 602 may include several first segments 608 having first thickness 604 formed prior to the formation of several second segments 610 having second thickness 612.

Figure 6G:
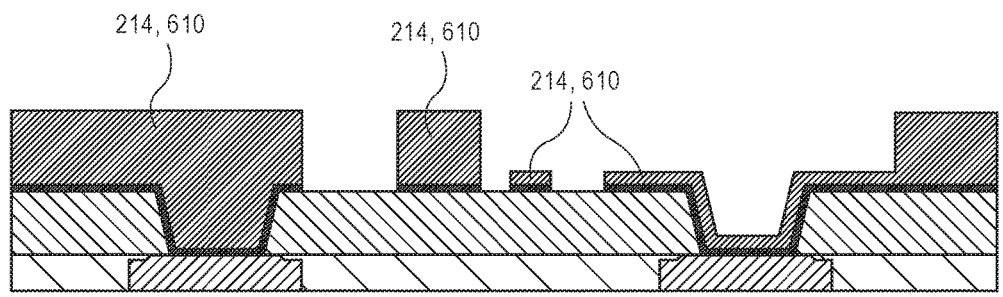

Referring to FIG. 6G, metal seed layer 410 between first segments 608 and second segments 610 may be removed. More particularly, first segments 608 may correspond to first conductive traces 212 having a smaller thickness and/or pitch as compared to second segments 610 corresponding to second conductive traces 214. Accordingly, a redistribution layer 112 having conductive traces that include different thicknesses and/or pitches may be fabricated.

Figure 7:
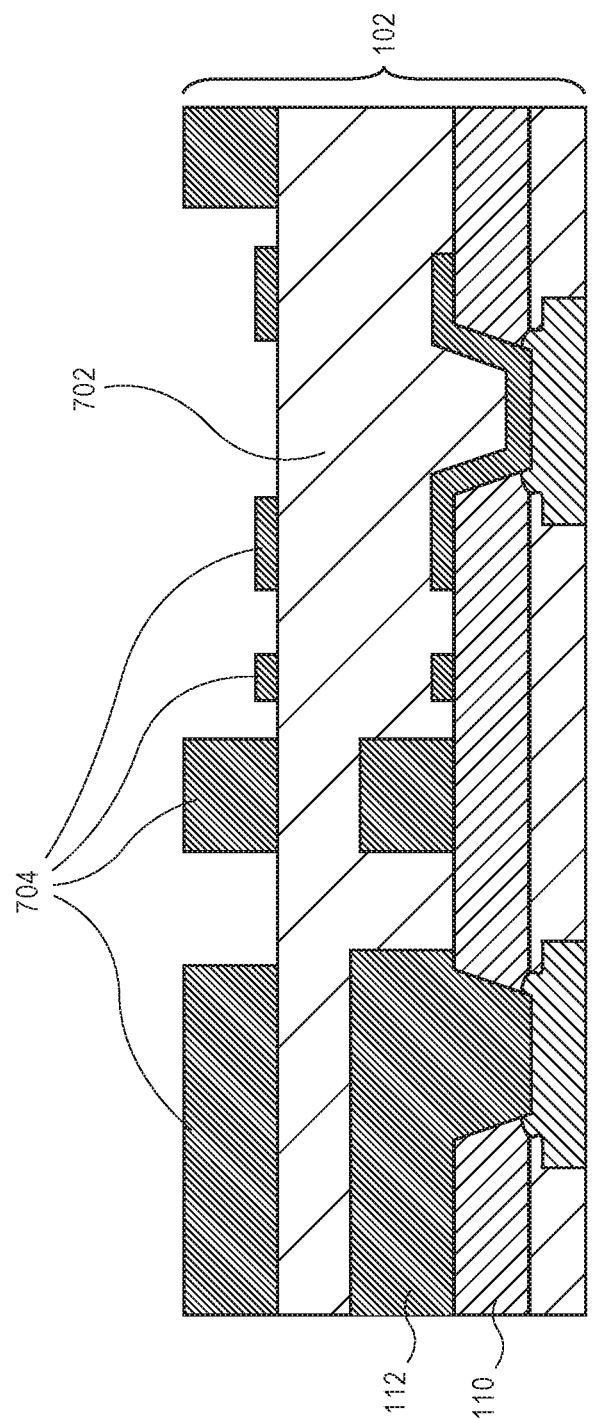
FIG. 7 illustrates a sectional view of a semiconductor package having a stack of several dielectric layers and several redistribution layers having variable thicknesses, in accordance with an embodiment.

Referring to FIG. 7, a sectional view of a semiconductor package having a stack of several dielectric layers and several redistribution layers having variable thicknesses is illustrated in accordance with an embodiment. As shown, several redistribution layers having variable conductive trace thicknesses may be stacked within wafer layer 102. For example, a second dielectric layer 702 may be deposited on redistribution layer 112 having the variable architecture described above. Redistribution layer 112 may be on dielectric layer 110 as described above. Furthermore, second dielectric layer 702 may include one or more openings, similar to those of dielectric layer 110, to allow vias to interconnect redistribution layer 112 on a first side of second dielectric layer 702 to a second redistribution layer 704 on a second side of second dielectric layer 702. That is, conductive traces of redistribution layer 112 may extend from respective openings 210 in dielectric layer 110 to respective openings in second dielectric layer 702, and the openings in second dielectric layer 702 may extend from the conductive traces of redistribution layer 112 to the conductive traces of second redistribution layer 704. In an embodiment, conductive traces of each stacked redistribution layer 112 may have corresponding thicknesses. That is, conductive traces having a thinner/smaller-pitch architecture in redistribution layer 112 may be electrically connected to conductive traces having a thinner/smaller-pitch architecture in second redistribution layer 704. Similarly, conductive traces having a thicker/larger-pitch architecture in redistribution layer 112 may be electrically connected to conductive traces having a thicker/larger-pitch architecture in second redistribution layer 704. Accordingly, conductive traces in each stacked redistribution layer 112 may be matched to a same corresponding electrical current signal.

Figure 8:
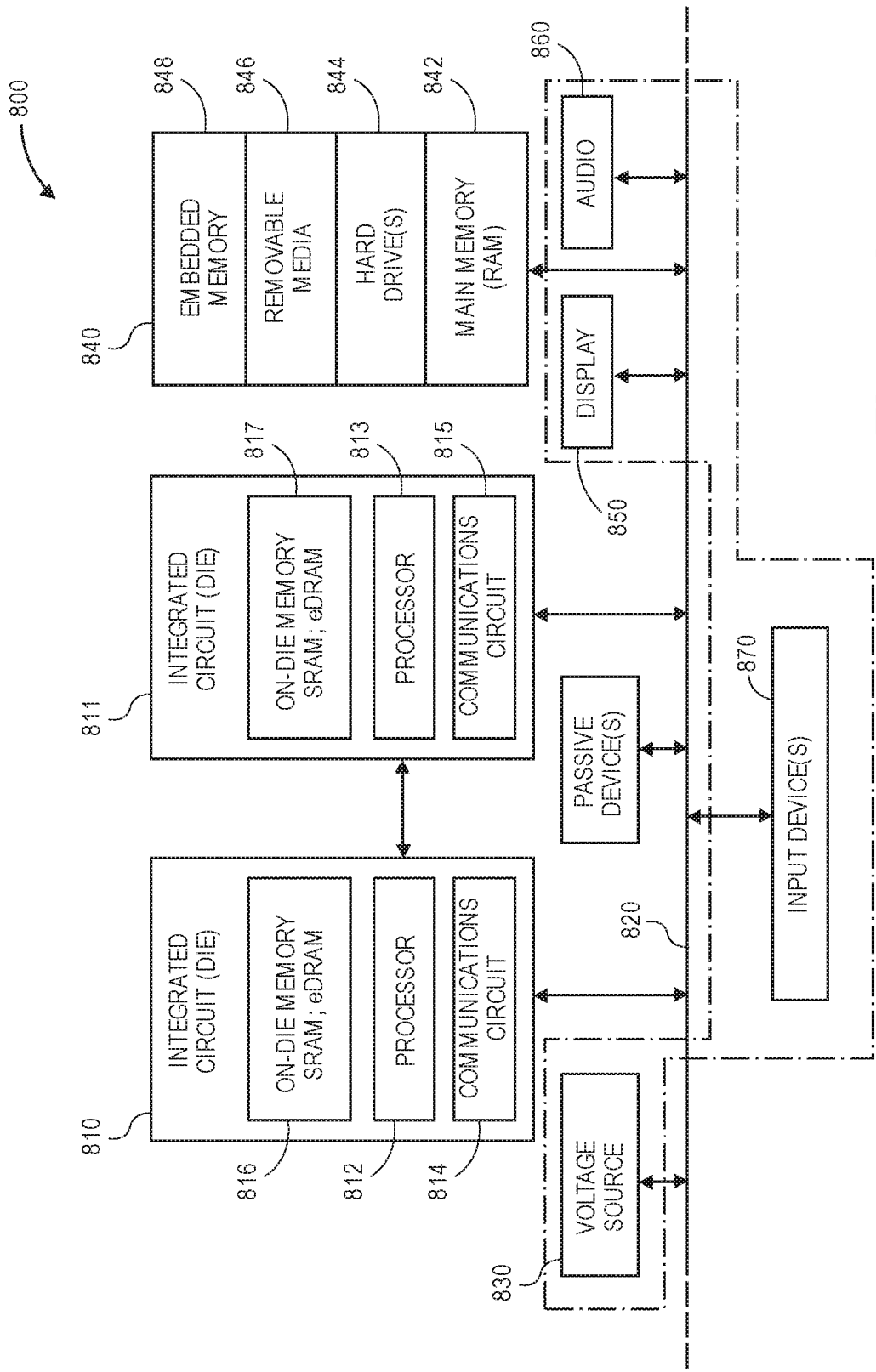
FIG. 8 is a schematic of a computer system, in accordance with an embodiment.

FIG. 8 is a schematic of a computer system, in accordance with an embodiment. The computer system 800 (also referred to as the electronic system 800) as depicted can embody a redistribution layer having conductive traces of differing thicknesses or pitches, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, a redistribution layer having conductive traces of differing thicknesses or pitches, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 811 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, and an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package substrate having a redistribution layer having conductive traces of differing thicknesses or pitches, according to any of the several disclosed embodiments and their equivalents, an electronic system, a computer system, one or more methods of fabricating an integrated circuit, and one or more methods of fabricating an electronic assembly that includes a package substrate having a redistribution layer having conductive traces of differing thicknesses or pitches, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a redistribution layer having conductive traces of differing thicknesses or pitches embodiments and their equivalents. A foundation substrate may be included, as represented by the dashed line of FIG. 8. Passive devices may also be included, as is also depicted in FIG. 8.

Embodiments of semiconductor packages having variable redistribution layer thicknesses or pitches are described above. It will be appreciated that the structure and methods described may be used to achieve advantages other than an improvement in trace routing efficiencies. For example, a variable redistribution layer thickness may allow for some portions of a product to have all thick conductive traces and other portions of a product to have all thin conductive traces. In an embodiment, the product may include a special RF region and a special logic area that would both benefit from conductive traces matched to their individual electrical current requirements. In such case, the methods described above may be used to form the conductive traces having a first respective thickness in the special RF region while protecting the special logic area, and to subsequently form the conductive traces having a second respective thickness in the special logic area while protecting the special RF region. Accordingly, conductive traces having different thicknesses within redistribution layer may be adjacent to one another or spaced apart from each other within the same physical layer. Thus, the embodiments described above are to be regarded as illustrative and not limiting.

In an embodiment, a semiconductor package, includes a dielectric layer having a front surface and a back surface opposite from the front surface. One or more openings extend from the front surface to the back surface. The semiconductor package further includes a redistribution layer on the back surface. The redistribution layer includes several first conductive traces having a first thickness and several second conductive traces having a second thickness. The first thickness is different than the second thickness.

In one embodiment, the first thickness is less than the second thickness.

In one embodiment, the first conductive traces extend over the back surface in a first regular pattern having a first pitch. The second conductive traces extend over the back surface in a second regular pattern having a second pitch. The first pitch is less than the second pitch.

In one embodiment, the first conductive traces include a first sub-layer having the first thickness. The second conductive traces include a second sub-layer on the first sub-layer.

In one embodiment, the conductive traces extend from respective first ends at respective openings in the dielectric layer to respective second ends. A first distance between the respective first ends is less than a second distance between the respective second ends.

In one embodiment, the semiconductor package further includes a second dielectric layer on the redistribution layer. The second dielectric layer includes one or more openings. The conductive traces extend from respective openings in the dielectric layer to respective openings in the second dielectric layer.

In one embodiment, the semiconductor package further includes a second redistribution layer on the second dielectric layer. The openings in the second dielectric layer extend from the redistribution layer to the second redistribution layer.

In one embodiment, the semiconductor package further includes a pair of solder pads on the back surface of the dielectric layer. The pad gap separates the pair of solder pads. Three or more first conductive traces extend through the pad gap between the pair of solder pads.

In one embodiment, a difference between the first thickness and the second thickness is at least 15% of the first thickness.

In one embodiment, the semiconductor package further includes an integrated circuit on the front surface. The integrated circuit includes several chip pads. The semiconductor package further includes several vias extending through the openings in the dielectric layer and electrically connecting the chip pads to the redistribution layer.

In an embodiment, a method includes depositing a patterned plating resist on a metal seed layer formed on a back surface of a dielectric layer. The first region of the metal seed layer is exposed through the patterned plating resist. The patterned plating resist covers a second region of the metal seed layer. The method further includes forming several first conductive traces having a first thickness on the first region. The method further includes removing the metal seed layer from a first subregion of the second region to form several second conductive traces having a second thickness on the second region, wherein the first thickness is different than the second thickness.

In one embodiment, the method further includes applying a patterned protective resist on a second subregion of the second region prior to removing the metal seed layer from the first subregion of the second region to form the several second conductive traces.

In one embodiment, the method further includes removing the patterned plating resist from the second region. The method further includes forming an additional sub-layer on the second conductive traces.

In one embodiment, the method further includes depositing a patterned protective resist on the first conductive traces prior to forming the additional sub-layer on the second conductive traces.

In one embodiment, the method further includes forming the additional sub-layer on the first conductive traces concurrently with forming the additional sub-layer on the second conductive traces.

In one embodiment, the first conductive traces are formed in a first regular pattern having a first pitch. The second conductive traces are formed in a second regular pattern having a second pitch, and wherein the first pitch is less than the second pitch.

In an embodiment, a method of fabricating a redistribution layer having conductive traces of differing thicknesses includes depositing a patterned plating resist on a metal seed layer formed on a back surface of a dielectric layer. A first region of the metal seed layer is exposed through the patterned plating resist. The patterned plating resist covers a second region of the metal seed layer. The method further includes forming a first thickness of a conductive pattern on the first region. The method further includes depositing a patterned protective resist on a first portion of the conductive pattern. A second portion of the conductive pattern is exposed through the patterned protective resist. The method further includes forming an additional thickness of the conductive pattern on the second portion such that the conductive pattern includes several first segments in the first portion having the first thickness and several second segments in the second portion having a second thickness. The second thickness includes the first thickness and the additional thickness.

In one embodiment, the method further includes removing the metal seed layer between the first segments and the second segments of the conductive pattern.

In one embodiment, the first segments are formed in a first regular pattern having a first pitch. The second segments are formed in a second regular pattern having a second pitch. The first pitch is less than the second pitch.

In one embodiment, the segments of the conductive pattern extend from respective first ends at respective openings in the dielectric layer to respective second ends. A first distance between the respective first ends is less than a second distance between the respective second ends.

What is claimed is:

1. A semiconductor package, comprising:
   an integrated circuit die encapsulated in a mold compound, the integrated circuit die having an exposed surface co-planar with a surface of the mold compound;
   a dielectric layer having a front surface and a back surface opposite from the front surface, wherein one or more openings extend from the front surface to the back surface, wherein the front surface of the dielectric layer is on the co-planar exposed surface of the integrated circuit die and on the surface of the mold compound; and
   a redistribution layer on the back surface, wherein the redistribution layer includes a plurality of first conductive traces, the plurality of first conductive traces immediately adjacent to each other and having a first thickness and a first pitch, and wherein the redistribution layer includes a plurality of second conductive traces, the plurality of second conductive traces immediately adjacent to each other and having a second thickness and a second pitch, and wherein the first thickness is different than the second thickness and both thicknesses are measured in a same direction normal to the exposed surface of the integrated circuit die, and wherein the first pitch is different than the second pitch.

2. The semiconductor package of claim 1, wherein the first thickness is less than the second thickness, and wherein the first pitch is less than the second pitch.

3. The semiconductor package of claim 2, wherein the first conductive traces extend over the back surface in a first regular pattern having the first pitch, wherein the second conductive traces extend over the back surface in a second regular pattern having the second pitch.

4. The semiconductor package of claim 3, wherein the first conductive traces include a first sub-layer having the first thickness, and wherein the second conductive traces include a second sub-layer on the first sub-layer.

5. The semiconductor package of claim 2, wherein the plurality of first conductive traces extend from respective first ends at respective openings in the dielectric layer to respective second ends, and wherein a first distance between the respective first ends is less than a second distance between the respective second ends.

6. The semiconductor package of claim 5 further comprising a second dielectric layer on the redistribution layer, wherein the second dielectric layer includes one or more openings, and wherein the plurality of first conductive traces extend from respective openings in the dielectric layer to respective openings in the second dielectric layer.

7. The semiconductor package of claim 6 further comprising a second redistribution layer on the second dielectric layer, wherein the openings in the second dielectric layer extend from the redistribution layer to the second redistribution layer.

8. The semiconductor package of claim 3 further comprising a pair of solder pads on the back surface of the dielectric layer, wherein a pad gap separates the pair of solder pads, and wherein three or more first conductive traces extend through the pad gap between the pair of solder pads.

9. The semiconductor package of claim 8, wherein a difference between the first thickness and the second thickness is at least 15% of the first thickness.

10. The semiconductor package of claim 1, wherein the integrated circuit die includes a plurality of chip pads; and the semiconductor package further comprises a plurality of vias extending through the openings in the dielectric layer and electrically connecting the chip pads to the redistribution layer.

* * * * *